United States Patent [19]

Miyazaki

[11] Patent Number: 4,587,185
[45] Date of Patent: May 6, 1986

[54] PHOTOMASK FOR USE IN MAKING A CARRIER TAPE
[75] Inventor: Shu Miyazaki, Fussa, Japan
[73] Assignee: Sumitomo Metal Mining Co., Ltd., Tokyo, Japan
[21] Appl. No.: 626,197
[22] Filed: Jun. 29, 1984

Related U.S. Application Data

[62] Division of Ser. No. 550,380, Nov. 10, 1983.

[30] Foreign Application Priority Data

Nov. 12, 1982 [JP] Japan ................... 57-198735

[51] Int. Cl.⁴ .................... G03F 9/00; G03C 5/00
[52] U.S. Cl. .......................... 430/5; 430/311; 430/313
[58] Field of Search ................. 430/5, 314, 313, 311

[56]  References Cited
U.S. PATENT DOCUMENTS 4,049,903  9/1977  Kobler ................... 174/68.5
4,512,843  4/1985  Miyazaki ................. 156/644

Primary Examiner—Mary F. Downey
Assistant Examiner—José G. Dees
Attorney, Agent, or Firm—Watson, Cole, Grindle & Watson

[57]  ABSTRACT

A photomask for use in making a carrier tape used for automatically bonding IC devices on a substrate and having therealong sets of finger leads and sprocket holes, the carrier tape being made by exposing a metallic foil tape that is coated with a photo resist material to radiation which has passed through the photomask, the photomask including an elongated section which defines an elongated middle portion and opposite elongated outer portions, as well as at least one finger lead pattern in the middle portion and a pair of associated sprocket holes in the respective outer portions for each finger lead pattern, the pairs of sprocket holes being displaced longitudinally of the elongated section with respect to their associated finger lead pattern.

4 Claims, 7 Drawing Figures

PHOTOMASK FOR USE IN MAKING A CARRIER TAPE

This application is a divisional application of application Ser. No. 550,380, filed Nov. 10, 1983.

BACKGROUND OF THE INVENTION

1. Field of the Invention

This invention relates to a method of making a carrier tape for feeding lead wires to semiconductor integrated circuit (IC) devices.

2. Description of the Prior Art

Although connections between electrodes on IC devices and external leads are generally made by wire bonding, it has been proposed recently to use a carrier tape as shown in FIG. 1 in order to automate the packaging of IC devices.

This carrier tape 1 is made of a metallic foil tape of copper, iron, iron-nickel alloy, etc., having a thickness of about 200 microns or less, and includes sprocket holes 2 provided at intervals along both edges of the tape, clusters of finger leads 3 provided at intervals along the middle of the tape. The surface of the metallic foil tape is entirely or partially coated with gold or tin, as required. In use of the carrier tape, the inner leads of the finger leads are positioned over the electrodes on the IC devices and collectively bonded thereto so as to fasten a succession of IC devices to the carrier tape. The outer ends of the leads are then cut and connected to external leads. During this procedure, the sprocket holes 2 are used to position the tape relative to the IC devices for the purpose of the above-mentioned collective bonding and cutting steps.

Although photoetching techniques enable high accuracy in the manufacture of carrier tapes, special difficulties arise because the tape is very thin as compared with usual sheet materials for which the technique is used. Whereas with usual sheet material sprocket holes are formed first of all and these used to locate and feed the tape during subsequent processing, with thin metallic foil tape, the sprocket holes tend to deform, thus preventing accurate, collective bonding of IC devices. For this reason, pinch rollers have been used to feed the metallic foil tape. But this, too, is unsatisfactory, since when the photoresist layer (which has been exposed to light through an elaborate mask) is pressed between the rollers, the latent patterns may be deformed, so that when these latent patterns are developed, the developed patterns for the sprocket holes and finger leads are also deformed. To avoid this disadvantage it has been proposed in (for example) U.S. Pat. No. 4,227,983 to use a metal foil tape which is wider than the finished carrier tape, so that the tape may be driven by rollers gripping the margin of the tape. Where the metallic foil tape which has been coated with photoresist is subjected to continuous exposure to light, however, positioning of the tape by means of grip rollers and roller guides can lead to uneven spacing and inaccurate directional alignment between the successive sets of sprocket holes and finger leads to be formed in the tape.

The inventor has previously proposed a method of making a carrier tape in which perforations are formed at desired intervals in the tape margin portion by punching and that the position alignment for exposure is carried out using the perforations as disclosed in my copending U.S. patent application Ser. No. 535,862, filed on Sept. 26, 1983, Pat. No. 4,512,843.

This proposed method enables more even spacing and greater directional accuracy as between successive sets of patterns than can be achieved using the grip roller system.

Various tools for the collective bonding of electrodes deposited on IC devices to inner leads have been proposed-see for example, Japanese Patent Publication No. 12790/78 and Provisional Publication No. 11664/79. However, because it is mechanically difficult to position the tape in the bonding tool for collective bonding using the sprocket holes immediately adjacent a particular cluster of finger leads, it is normal to use sprocket holes spaced some distance (upstream) from the cluster concerned for the purpose of aligning of the inner leads and electrodes.

When using a photomask 6, for example, having three successive sets of patterns for sprocket holes 4 and finger leads 5 as shown in FIG. 2A, a continuous carrier tape 1 is fed forward to present successive sections thereof to the mask to produce a continuing series of sets of sprocket holes 21, 22, etc., and finger lead patterns 31, 32, etc., as shown in FIG. 2B. Misalignment will not occur when the finger lead 31 in the exposure section (A) of the carrier tape 1 is intended to be aligned by means of the sprocket hole 22 or 23 (also in exposure section (A)) but, due to feed errors, misalignments may occur when it is required to position the finger leads 33 in the exposure section (A) using the sprocket hole 24 or 25 in the exposure section (B).

The reason for this is considered to be that the distance through which the tape is fed to bring successive sections thereof into the desired exposure position varies from one section to the next. That is, although alignment prior to exposure is carried out by sprocket holes which are provided in the margin (not shown) along each edge of the carrier tape 1 (as disclosed in the above-mentioned copending U.S. patent application), the accuracy of the punching operation to produce the sprocket holes in the margin determines the accuracy with which the tape is fed forward to bring the next section thereof beneath the mask. However, since the accuracy of the press is of the order of ±30 microns, it is almost impossible using tapes produced by conventional techniques, to accurately position finger leads relative to the IC devices. It is possible to decrease the frequency of bonding faults due to misalignment, by increasing the length, and hence also the number of pattern sets in the photomask but there is in practice a limit to the size of the section that can be exposed at one time. Consequently, bonding faults occur after constant intervals and cannot be avoided.

SUMMARY OF THE INVENTION

In accordance with the present invention I propose a method of making by photoetching a carrier tape having formed therealong a succession of sets of finger leads and associated sprocket holes with the sprocket holes along each of the opposite edges of the tape and the finger leads in a middle portion of the tape between the sprocket holes, comprising positioning a metallic foil tape coated with photoresist material for exposure to radiation, section by section, through a photo mask having at least one set of patterns, the or each set including a finger lead pattern and associated sprocket hole patterns spaced therefrom by a predetermined distance in the longitudinal direction of the tape.

The invention also includes a photo mask for use in the manufacture by photo etching of a carrier tape having a plurality of sets of sprocket holes and finger leads formed successively therealong with the sprocket holes along each of the opposite edges of the tape and the finger leads in a middle portion of the tape between the sprocket hole the mask having at least one set of patterns, the or each set including a finger lead pattern and associated sprocket hole patterns spaced therefrom by a predetermined distance such that, when in use the photo mask is presented to a metallic foil tape coated with photoresist for exposure thereof to radiation, the sprocket hole patterns are spaced from the finger lead patterns in the longitudinal direction of the tape.

The predetermined distance will in practice, depend upon the tool to be used for subsequent collective bonding of the finger leads to the electrodes of the IC devices. It is however preferred that the predetermined distance be equal to the pitch of the sets of patterns to be formed in the carrier tape or a multiple thereof. Since the finger lead pattern and the associated sprocket hole patterns (from which are produced sprocket holes intended for positioning the finger leads in the collective bonding tool) are, by virtue of the specified arrangement of patterns in the mask, always exposed at the same time, the distance between the finger leads and associated sprocket holes is the same for all sets. This accurate positioning in the collective bonding tool is possible irrespective of the accuracy with which the relative position of the mask and the tape is set when presenting successive sections of the tape to the mask for exposure to radiation.

A preferred embodiment of the method of this invention comprises providing metallic foil tape wider than the required width of the carrier tape, forming perforations at intervals along both edges of the metallic foil tape, applying photoresist material to the surface of the tape, positioning the tape for exposure to radiation using the perforations, and exposing the tape through a photo mask having at least one set of sprocket holes and finger lead patterns, the finger lead and sprocket hole patterns being displaced relative to each other by a predetermined distance preferably equal to at least one pitch of the noted sets.

BRIEF DESCRIPTION OF THE DRAWINGS

Embodiments of the present invention will now be described by way of example with reference to the accompanying drawings of which.

DETAILED DESCRIPTION OF PREFERRED EMBODIMENTS

Figure 1:
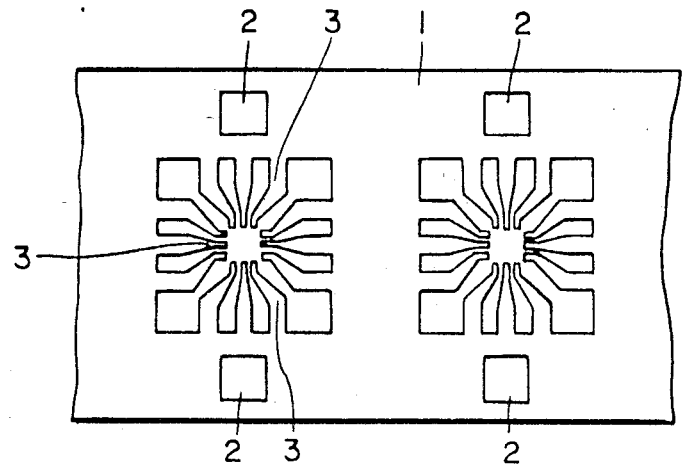
FIG. 1 shows a portion of a carrier tape.
Figure 2A:
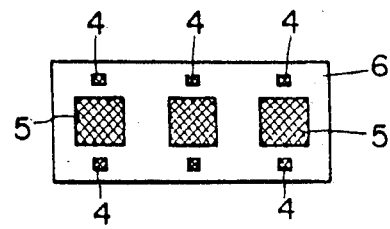
FIG. 2A shows a conventional photo mask.
Figure 2B:
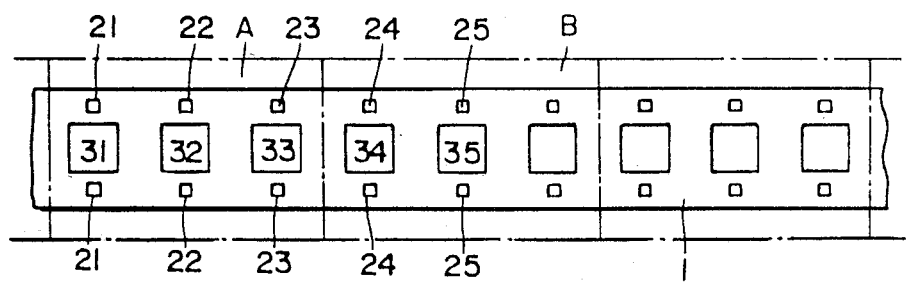
FIG. 2B illustrates how the conventional photo mask of FIG. 2 is used to make a carrier tape.
Figure 3A:
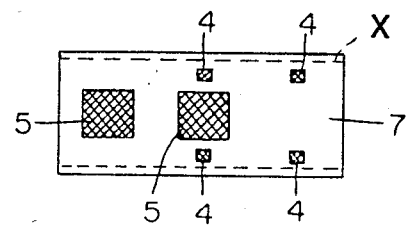
FIGS. 3A and 4A each show a photo mask according to the present invention.
Figure 3B:
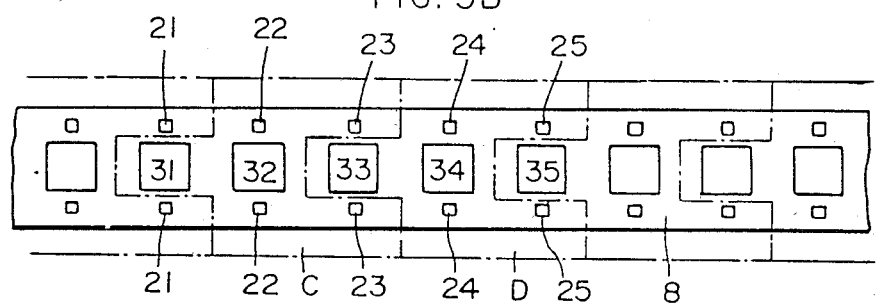
FIGS. 3B and 4B each illustrate the photo masks of FIGS. 3A and 4A respectively and are used in accordance with the present invention, to make a carrier tape.

The photo mask 7 shown in FIG. 3A comprises a base member having an elongated section X (indicated by dashed lines) that is divided into an elongated middle portion and opposite elongated outer portions, and it includes two sets of patterns, each set including patterns 4 located in the respective opposite elongated portions of the elongated section X for forming sprocket holes and a pattern 5 located in the elongated middle portion of the elongated section X for forming finger leads (they are simply illustrated as a hatched pattern in the drawings) but, in each set, the finger lead pattern 5 is shifted relative to the sprocket hole patterns 4 in a leftward direction by the axial pitch of the patterns. Such a photo mask 7 can be produced in the same manner as the conventional photo mask 6 (referred to in FIG. 2A). Further, sprocket holes are punched at desired intervals in the margin along both edges of a metallic foil tape which is wider than the width of the finished carrier tape and the tape is coated with photoresist on both surfaces thereof. Thereafter, both surfaces of the tape are exposed using the photo mask 7, and intermittently feeding the photo mask relative to the tape (or vice versa) by a distance equal to twice the pitch of the patterns, using the sprocket holes. A carrier tape 8 having a configuration similar to that of a conventional tape (FIG. 1) can be obtained as shown in FIG. 3B.

It will be understood, however, that each cluster of finger leads 31, 32, etc., and the sprocket holes adapted for positioning that cluster 22, 23, are exposed at the same time. Thus, the distance between each finger lead cluster and the associated sprocket holes is constant and will not be affected by variations or errors in the distance which the tape and the mask are shifted relative to one another in moving from exposure section (C) to the exposure section (D).

Figure 4A:
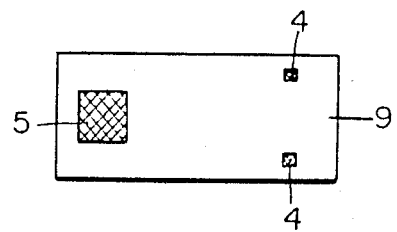
Figure 4B:
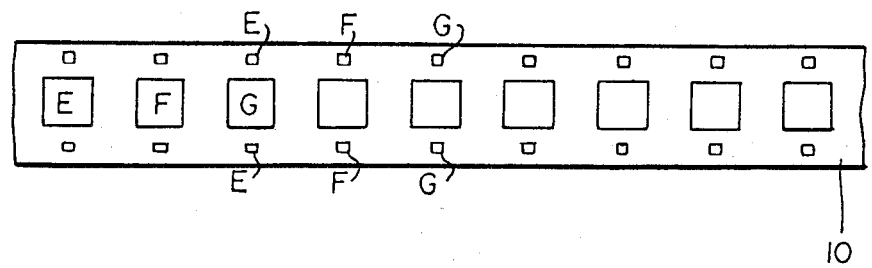

The above method is for producing a carrier tape which is adapted to enable accurate location of one finger lead pattern using the sprocket holes formed adjacent the next finger lead pattern, that is to say the sprocket holes trailing (in the direction of relative movement) the finger lead pattern by one pitch. In the mask 9 shown in FIG. 4A, the finger lead pattern 5 is shifted relative to the sprocket holes pattern 4 by twice the intended pitch between sets of patterns in the finished carrier tape, and each exposure of the tape is performed after feeding the mask by one pitch. In the carrier tape 10 (shown in FIG. 4B) produced using the mask 9, the distance between each finger lead cluster and each sprocket hole in all of the exposure sections (E), (F) and (G) is constant so that inaccuracies as between the distance fed in presenting the sections (E), (F) and (G) for exposure will not affect the ability to accurately locate the finger leads for collective bonding.

It will be apparent that the present invention is not limited to the mask configurations illustrated above. Further, for producing a plurality of carrier tapes at the same time, although a metal foil tape that is wider than the total width of the carrier tapes may be used in conjunction with a photo mask having a plurality of patterns side by side may be employed according to the number of carrier tapes.

As described above in detail the present invention enables the manufacture of carrier tapes which are suitable for use in collective bonding machines wherein alignment of a finger lead cluster and an IC device is achieved using sprocket holes spaced from the finger lead cluster by a distance greater than the distance between successive finger lead clusters. In addition, since the variations in the distance between the finger leads and the associated sprocket holes to be used for positioning can be reduced to below ±10 microns, bonding faults due to the misalignment of the inner leads and the electrodes can be avoided to improve the yield of the material and to decrease the cost of manufacture.

I claim:

1. A photomask for use in making a carrier tape, said photomask consisting of a base element which includes an elongated section that is divided into an elongated middle portion and opposite elongated outer portions, said base element having a single finger lead pattern and a single pair of aligned sprocket hole patterns extending therethrough, said single finger lead pattern being located in said elongated middle portion of said elongated section and the sprocket hole patterns of said single pair of aligned sprocket hole patterns being respectively located in said opposite elongated outer portions of said elongated section, said single pair of aligned sprocket hole patterns being displaced along said elongated section from said single finger lead pattern a certain distance equal to one pitch or multiples thereof, said single finger lead pattern having no sprocket hole patterns located laterally outwardly thereof and said single pair of sprocket hole patterns having no finger lead pattern located laterally inwardly thereof; said photomask being positionable between a light source and a metallic foil tape having a photoresist material on a side thereof which faces said photomask such that light passing through said photomask can strike sequential portions of said photoresist material on said metallic foil tape and form finger lead clusters in a middle part thereof and aligned pairs of sprocket holes along opposite outer parts thereof, said metallic foil tape being provided with a succession of figure lead clusters formed in the middle part thereof which are separated by a distance equal to one pitch and, each finger lead cluster having a pair of aligned sprocket holes located laterally thereof along the length of said metallic foil tape, except for the number of figure lead clusters at the lead end of said metallic foil tape equal to the number of pitches the single pair of aligned sprocket hole patterns are spaced from the single figure lead pattern on said photomask.

2. A photomask as defined in claim 1, wherein said single pair of sprocket holes is displaced with respect to said single finger lead pattern by one said pitch.

3. A photomask as defined in claim 1, wherein said single pair of sprocket holes is displaced with respect to said single finger lead pattern by multiples of said pitch.

4. A photomask for use in making a carrier tape, said photomask consisting of a base element which includes an elongated section that is divided into an elongated middle portion and opposite elongated outer portions, said base element having a plurality of aligned sprocket hole patterns extending therethrough, said finger lead patterns being located in said elongated middle portion of said elongated section and spaced apart a certain distance equal to one pitch or multiples thereof and the sprocket hole patterns of said pairs of aligned sprocket hole patterns being respectively located in said opposite elongated outer portions of said elongated section and said pairs of aligned sprocket hole patterns being spaced apart said certain distance, the finger lead pattern at one end of said elongated section having no pair of sprocket hole patterns located laterally outwardly thereof and the pair of sprocket hole patterns at the opposite end of said elongated section having no finger lead pattern located laterally inwardly thereof; said photomask being positionable between a light source and a metallic foil tape having a photoresist material on a side thereof which faces said photomask such that light passing through said photomask can strike sequential portions of said photoresist material on said metallic foil tape and form finger lead clusters in a middle part thereof and aligned pairs of sprocket holes along outer parts thereof, said metallic foil tape being thus provided with a succession of finger lead clusters formed in the middle part thereof which are separated by a distance equal to one pitch and, except for the first finger lead cluster at the lead end of said metallic foil tape, each finger lead cluster having a pair of aligned sprocket holes located laterally thereof along the length of said metallic foil tape.

* * * * *